United States Patent [19]

Chia et al.

[11] Patent Number: 5,643,835

[45] Date of Patent: Jul. 1, 1997

[54] PROCESS FOR MANUFACTURING AND MOUNTING A SEMICONDUCTOR DEVICE LEADFRAME HAVING ALIGNMENT TABS

[75] Inventors: Chok J. Chia, Campbell; Seng-Sooi Lim, San Jose, both of Calif.

[73] Assignee: LSI Logic Corporation, Milpitas, Calif.

[21] Appl. No.: 602,896

[22] Filed: Feb. 16, 1996

Related U.S. Application Data

[60] Continuation of Ser. No. 340,727, Nov. 16, 1994, abandoned, which is a division of Ser. No. 992,643, Dec. 18, 1992, abandoned.

[51] Int. Cl.$^6$ .............................. H01L 21/56; H01L 21/58; H01L 21/60
[52] U.S. Cl. .................... 437/211; 437/217; 437/220
[58] Field of Search ................................ 437/207, 211, 437/924, 217, 182, 220; 257/693, 797, 666.3, 774, 696, 773, 735; 361/773, 776

[56] References Cited

U.S. PATENT DOCUMENTS

| | | | |
|---|---|---|---|
| 5,018,005 | 5/1991 | Lin et al. | 257/797 |
| 5,104,827 | 4/1992 | Schneider et al. | 437/211 |
| 5,177,326 | 1/1993 | Goldhammer | 257/693 |

FOREIGN PATENT DOCUMENTS

| | | | |
|---|---|---|---|
| 61-148850 | 7/1986 | Japan. | |
| 63-65660 | 3/1988 | Japan. | |
| 1-120044 | 5/1989 | Japan | 257/695 |
| 362562 | 3/1991 | Japan. | |
| 3108360 | 5/1991 | Japan. | |
| 469960 | 3/1992 | Japan. | |
| 4-129259 | 4/1992 | Japan | 257/797 |
| 4277673 | 10/1992 | Japan. | |

*Primary Examiner*—David E. Graybill
*Attorney, Agent, or Firm*—Katz & Cotton, LLP

[57] ABSTRACT

A process of mounting a semiconductor device and leadframe to a printed circuit board are described. The device has a body, and a plurality of leads extending from the body. One or more alignment features are formed on the exterior of the package body, for maintaining precise alignment of the device with respect to a printed wiring board. The alignment feature is a tab formed as part of portion of the leadframe external to the package body. The tab may have various shapes, and may be provided with a hole for registering with a pin on an underlying substrate, such as a printed wiring board. The pin and the tab may be electrically connected.

6 Claims, 5 Drawing Sheets

PROCESS FOR MANUFACTURING AND MOUNTING A SEMICONDUCTOR DEVICE LEADFRAME HAVING ALIGNMENT TABS

This application is a continuation of application Ser. No. 08/340,737, filed Nov. 16, 1994, now abandoned which application is a divisional of application Ser. No. 07/992,643, filed Dec. 18, 1992, abandoned.

TECHNICAL FIELD OF THE INVENTION

The invention relates to the packaging of semiconductor devices and, more particularly to leadframe-based packages having external leads.

BACKGROUND OF THE INVENTION

A packaged semiconductor device (integrated circuit) typically includes a semiconductor die connected in some manner to inner ends of conductive lines. The outer ends of the conductive lines interface with signals entering and exiting the semiconductor device, from external systems. The packaged semiconductor device may be mounted in a socket or to a printed wiring board (PWB), which board has wiring traces on one or both sides and which may have additional components mounted thereto.

The conductive lines in the semiconductor package include either conductive leads of leadframes, or conductive traces on a substrate, such as a ceramic or printed circuit board (PCB) substrate.

The conductive leads may be relatively flexible, such as for tape automated bonding (TAB), in which case the leads are supported by a tape backing. External, more rigid leads may be connected to the ends of the relatively flexible conductive leads.

On the other hand, the conductive leads of the leadframes may be relatively rigid, such as for plastic molding a package body around the die. In this case, the die is typically mounted to a central die paddle of the lead frame, which may be in-plane or out-of-plane with respect to the conductive leads, and is typically wire bonded to the inner ends of the conductive leads. Outer ends of the conductive leads exit the package. The external (to the package body) portions of the conductive leads may be relatively straight (generally in-plane with respect to the lead frame), or may be bent one or more times to form legs or the like. In either case, the external portions of the leads are typically soldered to wiring traces on a PWB, by surface mounting the package to the PWB, or the leads urge against contacts in a socket.

Modern semiconductor devices may have many leads (high lead count), in which case the external portions of the device leads are small (fine) and of fine pitch (closely-spaced). Avoiding damage to the device leads during handling and assembly to a PWB is a problem addressed by commonly-owned U.S. Pat. No. 5,051,813.

For soldering the leads of the semiconductor device to a PWB, the PWB will have a corresponding large number of closely-spaced wiring traces distributed and spaced to match the pattern of the device leads. Hence, another problem with high lead count devices is that for surface mounting the semiconductor device to the PWB, a high degree of precision and accuracy is required to ensure that the device leads align with the corresponding PWB traces. The aforementioned U.S. Pat. No. 5,051,813 discloses forming plastic webs between the external leads, forming plastic bumps on the webs, and providing the PWB with recesses corresponding to the bumps. The recesses and bumps allow for precise alignment of the device to the PWB, but suffer from what could be perceived as two limitations: (1) a special mold is required to form the bumps; and (2) the bumps and PWB recesses, residing as they do between respective leads and wires, utilize space between the leads and traces and limit the lead/trace pitch that would otherwise be available.

In the main, hereinbelow, plastic packaged semiconductor devices having external leads are discussed, but the techniques disclosed herein have applicability to other types of semiconductor packaging.

Present plastic packaging techniques involve molding a plastic "body" around a semiconductor die. Prior to molding, the die is mounted and connected to a lead frame having a plurality of leads ultimately exiting the package for connecting the semiconductor device to external circuits, such as wiring traces on a printed wiring board (PWB). Various forms of plastic packages are known, including DIP (Dual In-line Package), PQFP (Plastic Quad Flat Pack) and PLCC (plastic leaded chip carrier).

DISCLOSURE OF THE INVENTION

It is therefore an object of the present invention to provide an improved technique for permitting accurate alignment of a semiconductor device to a PWB (or the like).

It is another object of the present invention to provide a technique for ensuring accurate alignment of plastic-packaged semiconductor devices to a PWB (or the like).

It is another object of the present invention to provide a technique for ensuring accurate alignment of plastic-packaged semiconductor devices to a PWB (or the like), without requiring modifying the mold set.

It is another object of the present invention to provide a technique for ensuring accurate alignment of plastic-packaged semiconductor devices to a PWB (or the like), without limiting the lead pitch.

It is another object of the present invention to provide an arrangement of a leaded semiconductor device and a corresponding PWB wherein accurate alignment of the device leads to the PWB traces is ensured.

According to the invention, a semiconductor device has a body and a plurality of leads extending from the body. An alignment feature is disposed on the exterior of the package body in a position remote from the leads (in other words, not between adjacent leads).

According to a feature of the invention, the semiconductor device is a plastic-packaged semiconductor device having a leadframe, and a plurality of leads exiting the package body. The alignment feature is formed integrally as part of the leadframe.

According to an aspect of the invention, the alignment feature is formed as a tab on an external portion of the leadframe. The external portion of the leadframe is defined as that portion which resides outside the package body after molding.

In one embodiment, the tab is round. In another embodiment, the tab is provided with a hole, for aligning with a pin disposed on a PWB or test socket. In another embodiment, the tab is semicircular. In another embodiment, the tab is "Y"-shaped. In another embodiment, the tab is trapezoidal shaped.

It should be understood that the semiconductor device of the present invention can be mounted to media other than printed wiring boards, but all such media will have connectivity locations such as the wiring patterns of the printed wiring boards.

The present invention is especially useful when lead "pitch", i.e. the center-to-center dimension between adjacent leads, is 0.5 mm or less, in which case the lead spacing "s" is on the order of 0.25 mm or less.

Other objects, features and advantages of the invention will become apparent in light of the following description thereof.

DETAILED DESCRIPTION OF THE INVENTION

Figure 1:
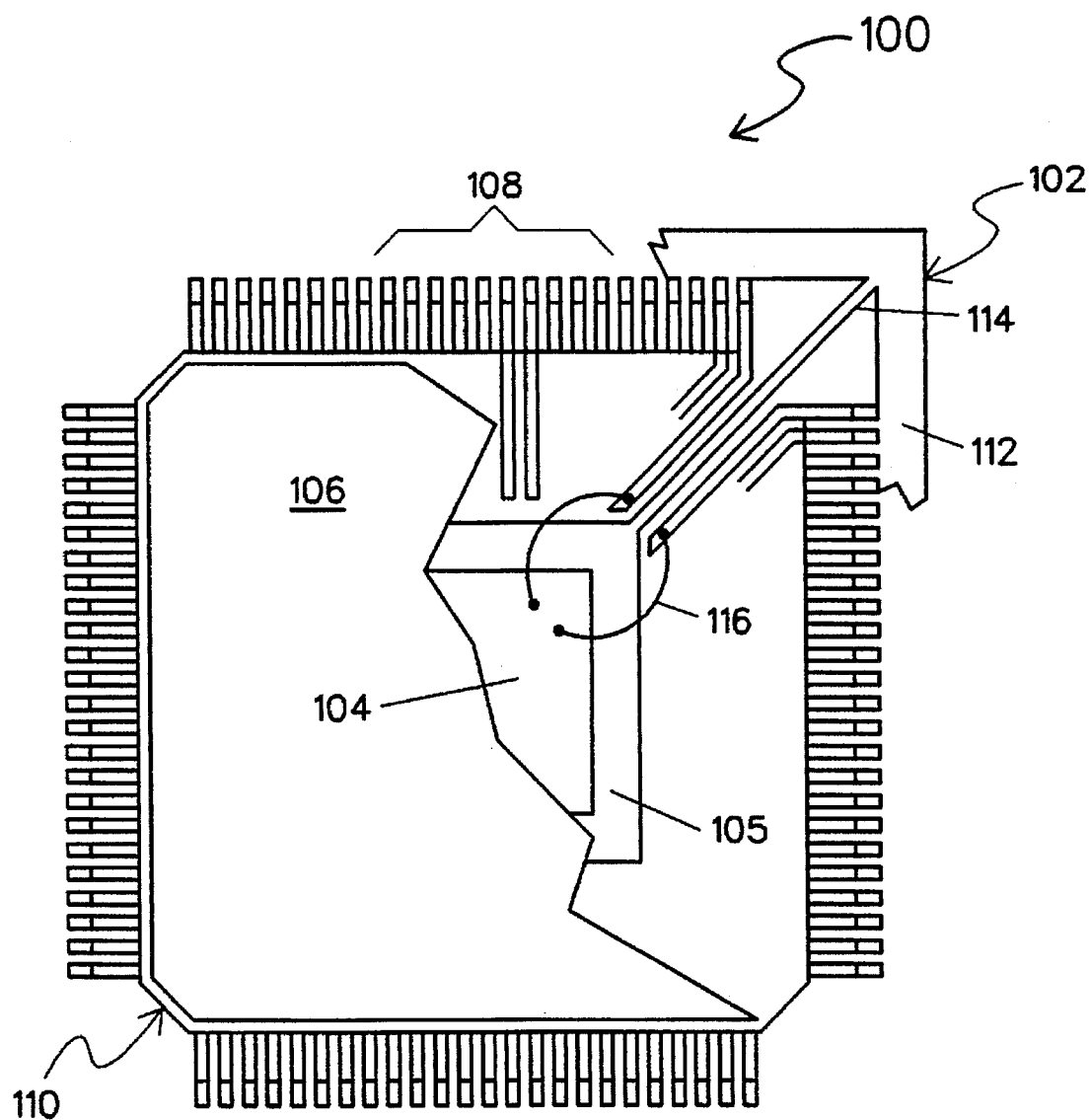
FIG. 1 is a top plan view, partially cutaway, of a prior art packaged semiconductor device, with leads on all four sides.

FIG. 1 shows a plastic-packaged semiconductor device 100 of the prior art. The techniques for manufacturing such packages are well known, including techniques for manufacturing a leadframe 102, mounting and connecting a die 104 to the a die paddle 105 of the lead frame, and molding a plastic body 106 about the die and inner portions of lead frame leads 108. The Figure shows a typical position 110 of a mold gate (not shown) for transferring molding compound (not shown) into a mold cavity (not shown) to form the body. For background information on plastic packaging, see e.g., *Microelectronics Packaging Handbook*, Tummala and Rymaszewski, Van Nostrand Reinhold, 1988, pp. 578–591.

An outer lead frame ring 112 extends entirely around the lead frame (shown only at one corner of the package, for clarity), and supports the outer ends of the leads 108 during handling and molding, but is later excised (removed). (Otherwise, all of the leads would be shorted out). The plurality of leads 108 extend from inner edges of the outer ring 112 towards the interior of the ring 112 (i.e., towards the die), and are generally coplanar with the ring 112. Ultimately, outer portions of the leads will extend from sides (e.g., from side edges) of the package body 106, as shown in the Figure. In other words, an internal portion of the lead frame is disposed within the package body, and includes the inner portions of the leads 108 and the die paddle 105, and an external portion of the lead frame is disposed without the package body, and includes the outer portions of the leads (and outer ring, which is ultimately excised).

In the Figure, only a few leads 108 are shown extending to the die, as exemplary of the many leads that would extend thereto. The die is connected to the inner ends of the leads with bond wires 116. A few such connections are shown in the Figure, being made to corner-most leads of the lead frame, and are merely exemplary of the many such connections that would be required (one connection to the die per lead).

It is also known to provide a tiebar 114 from the outer ring 112 to the die paddle 105, to support the die paddle in position. After molding, the tiebar(s) become(s) essentially superfluous, and is (are) excised along with the outer ring.

The completed, packaged semiconductor device (with outer ring and tiebar excised, and "dejunked" of plastic which has "flashed" outside of the package body, if necessary) can be surface mounted to a PWB so that the external portions of the leads extending outside of the package body align with and are soldered (or the like) to corresponding wiring traces (not shown) on a PWB (not shown).

By way of additional background, the leadframe may be formed of a conductive foil having a thickness on the order of a few thousandths of an inch, and the leads themselves may have a width on the order of six thousandths of an inch, or less. The spacing between adjacent leads is on the order of ten thousandths of an inch, or less. The material of which the leadframe is formed is typically copper, or "Alloy 42". In some cases, the leads are gold plated.

By way of further background, in the molding process, the lead frame (with die attached) is pressed between the two "clamshell" halves of a mold. The die and inner ends of the leads are contained within a cavity formed by the mold halves. The cavity is filled with a plastic molding compound.

As the lead count (number of leads) of semiconductor devices increases, the leads tend to become thinner, narrower and more closely spaced, and are quite fragile, Aside from problems of damaging the leads during handling or assembly to a PWB, as the leads become more fragile, it becomes increasingly difficult to maintain alignment of the leads with the conductors of wiring patterns on printed circuit boards to which the semiconductor devices are mounted.

According to the invention, an "alignment feature" is provided on the package, and facilitates alignment of fine pitch leaded packages in test sockets, in surface mounting and for locating the packages in shipping trays. In a preferred embodiment, the alignment feature is a tab formed from the leadframe itself, and which protrudes beyond the body (e.g., plastic body) of the package. Such a tab can be formed using the same processes (etching, punching) that are used to form the lead frame leads and tiebar. The tabs have indentations, or holes, or flat edges which are useful for aligning the package.

In the context of mounting the device in a test socket, corresponding features on the socket would mate with the tabs on the package. The package can thus be precisely located when inserted into the socket, ensuring good alignment and contact between the device leads and the socket contacts.

In the context of shipping semiconductor devices, the packages are held in trays, which may be provided with corresponding alignment features to reference off of the tabs.

In the context of surface mounting the devices, the tabs can be used as fiducials for aligning the packages onto the (PWB) boards. The boards may also be provided with corresponding alignment features, such as pins.

For purposes of the discussion that follows, it is assumed that the semiconductor device is mounted to, supported by, or inserted into an "underlying substrate", which may be any of the aforementioned PWB, tray, test socket, or the like.

In present test sockets, the packages are aligned using the package body itself, or the edges of the corner leads, as alignment guides. Using the package body itself for alignment will not provide a good reference for the leads, since there are small variations in the position of the package body vis-a-vis the leads. Using the corner leads for alignment can damage those leads.

In present shipping trays, the packages are held in place using ridges formed on the tray that fit between the leads and the package body. This can damage the leads.

In present surface mounting techniques, alignment is effected using the package body and the outer ends (tips) of the leads as visual guides.

One problem with any of the techniques for using the package body to align the leads of the semiconductor device is that the tolerances in the mold tools (i.e., for plastic molded bodies) do not allow the body to be sufficiently precisely positioned with respect to the leads. This can cause a misalignment of the leads with the conductors of the underlying substrate (e.g., test socket or PWB). A problem with using the surfaces of any of the leads for alignment is potential bending of the leads, which will cause damage to the device. In surface mounting, the package body cannot be used for effective alignment, since the shape and size of the package body tends to be non-precise. In shipping trays, the ridges formed between the leads and the body come into physical contact with the leads, which can cause the leads to bend when the trays are dropped or handled roughly. Using corner leads for alignment can also cause those leads to be bent. These problems are especially severe with lead dimensions on the order of 0.5 mm (millimeter) or less.

Figure 2:
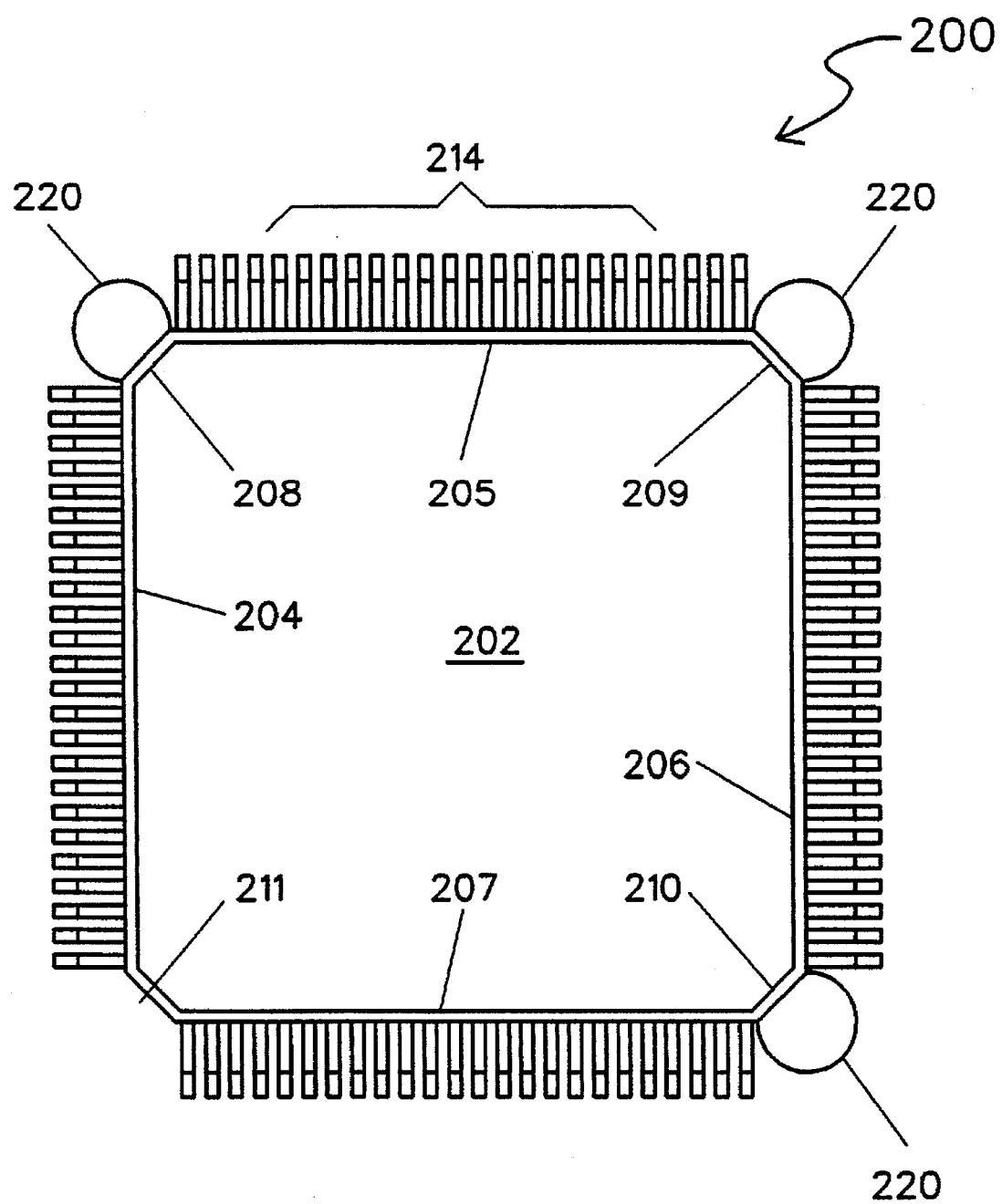
FIG. 2 is a top plan view of a packaged semiconductor device, according the present invention.

FIG. 2 shows an embodiment 200 of the invention, which is similar in many respects to the device 100 of FIG. 1. More particularly, those elements within the package body 202 are omitted from the view of FIG. 2, for illustrative clarity, and include: the interior portion of the lead frame, die, die paddle, bond wires. The package 200 is shown post-excising of the outer lead frame ring. In other words, the device 200 is shown ready for shipping, mounting or testing.

The package body 202 is generally square (rectangular), having four sides 204, 205, 206, 207, and four corners 208, 209, 210, 211. Outer portions of leads 214 extend from the four sides of the package body.

In contrast to the tiebar of the prior art (114, FIG. 1), which is used to support the die paddle (105, FIG. 1) and is then excised (removed), in the present invention an alignment feature, shown as a round tab 220, is disposed at each of three corners 208, 209, 210 of the package body. The fourth corner 211 would typically be used for gating plastic molding compound (see 110, FIG. 1).

The tab 220 is disposed within the outer ring of the leadframe, and is formed in the same manufacturing process as the remaining parts (outer ring, die paddle, leads) of the leadframe. Techniques such as etching or stamping are typically employed for manufacturing leadframes, and these techniques tend to be extremely precise. Hence, the size and shape of the tabs 220 can be carefully controlled. Moreover, the precise position of the tabs 220 relative to the leads 214 can be very precisely controlled, with a much greater precision than the relative positioning of the package body 202 and the leads 214 can be controlled in plastic molding.

Alternative shapes for the tab 220 are discussed hereinbelow. In any case, the tab 220 provides an extremely accurate reference for determining the position of the leads.

By using the tab as a reference, inaccuracies in the ultimate placement of the body on the leadframe are avoided, and bending problems associated with using the leads themselves (e.g., corner leads) as references are avoided.

In FIGS. 1 and 2, the package body 106, 202 has a double line, which indicates a slight chamfer on the package body. Such chamfer is not germane to the present invention.

Figure 2A:
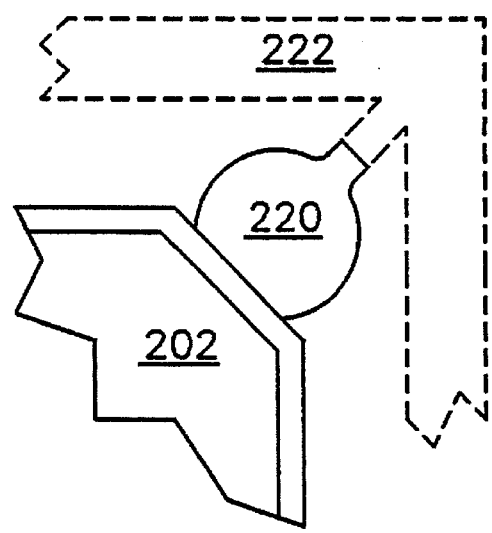
FIG. 2A is a more detailed view of one embodiment of the packaged semiconductor device of FIG. 2.

FIG. 2A shows one tab 220 in greater detail, extending from a corner (e.g., 209) of the package body 202. In this view, an outer lead frame ring 222 is illustrated in dashed lines, and the tab 220 is shown with a vestige of a tiebar (compare 114, FIG. 1) distorting its otherwise circular profile. Leads (compare 214, FIG. 2) are omitted from this view.

Figure 2B:
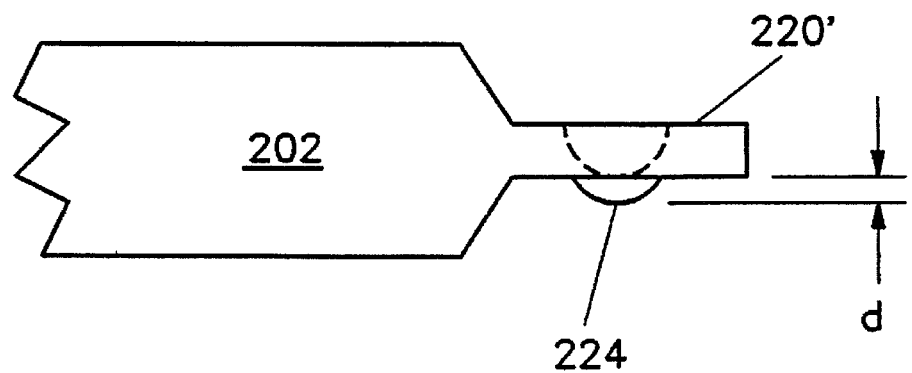
FIG. 2B is a side view of another embodiment of the invention.

FIG. 2B shows an alternate version 220' of the tab 220, where the tab has been dimpled, or indented, so that it extends out-of-plane (i.e., with respect to the leadframe). The size and depth "d" of the dimple 224 is preferably sufficient to aid in locating the tab vis-a-vis a cooperating feature (i.e., a recess) on the underlying substrate. The dimple is preferably formed by stamping, in the same process as stamping the leadframe.

Figure 3:
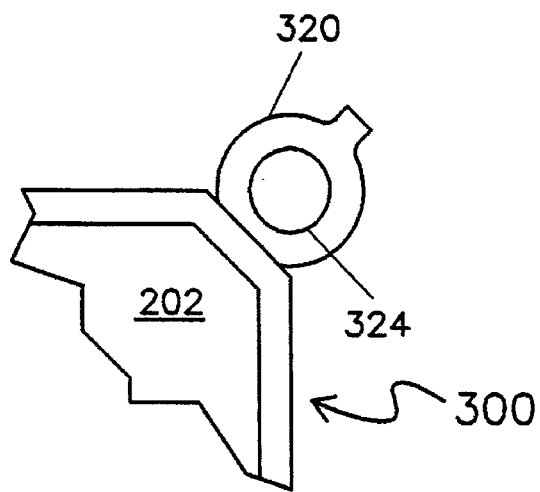
FIG. 3 is a top plan view of an alternate embodiment of the invention.

FIG. 3 shows an alternate embodiment 300 of the alignment feature (tab). In this case, the tab 320 is round (similar to 220), and has a hole 324 extending therethrough for alignment with a pin extending out of the underlying substrate. Such a pin is discussed hereinbelow, with respect to FIG. 7. Again, a vestige of a tiebar interrupts the otherwise circular profile of the tab 320 (compare 220). This embodiment may be formed by etching, stamping, or any other suitable technique by which lead frames are formed.

Figure 4:
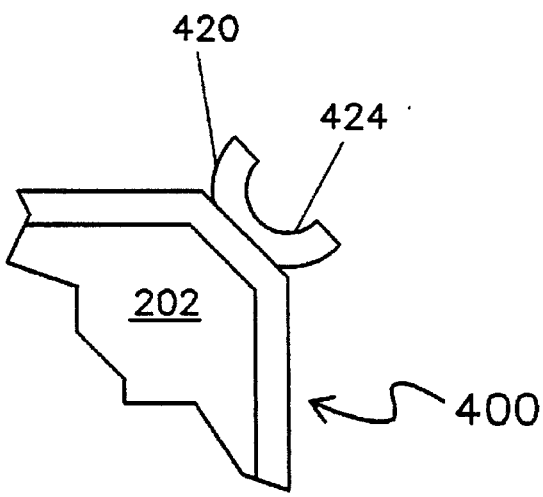
FIG. 4 is a top plan view of an alternate embodiment of the invention.

FIG. 4 shows an alternate embodiment 400 of the alignment feature (tab). In this case, the tab 420 is half round (semicircular), and has a half-round notch 424. The notch may be used for alignment with a pin, or the like, extending out of the underlying substrate. This embodiment may be formed by etching, stamping, or any other suitable technique by which lead frames are formed.

Figure 5:
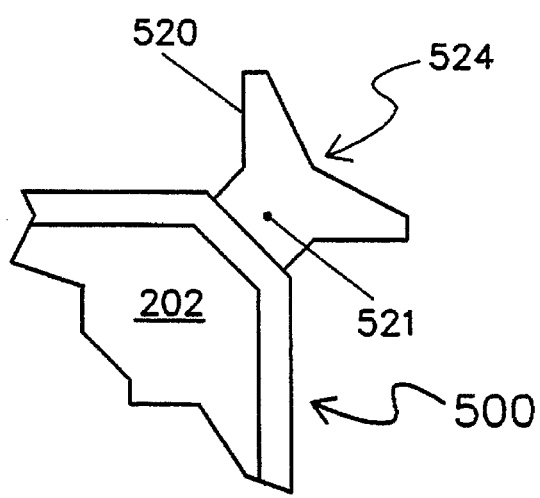
FIG. 5 is a top plan view of an alternate embodiment of the invention.

FIG. 5 shows an alternate embodiment 500 of the alignment feature (tab). In this case, the tab 520 is "Y" shaped, with the base 521 of the "Y" disposed towards the corner of the package body 202. The notch 524 of the "Y"-shaped tab extends away from the package body, and may be used for alignment with a pin, ridge or the like, extending out of the underlying substrate. This embodiment may be formed by etching, stamping, or any other suitable technique by which lead frames are formed.

Figure 6:
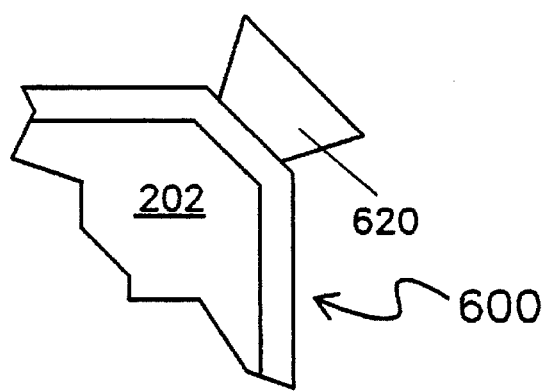
FIG. 6 is a top plan view of an alternate embodiment of the invention.

FIG. 6 shows an alternate embodiment 600 of the alignment feature (tab). In this case, the tab 620 is trapezoidal shaped, with a short side disposed towards the corner of the package body 202, and a long side disposed away from the package body. This embodiment may also be provided with a hole, as in the embodiment 300 of FIG. 3, and may be formed by etching, stamping, or any other suitable technique by which lead frames are formed.

Figure 7:
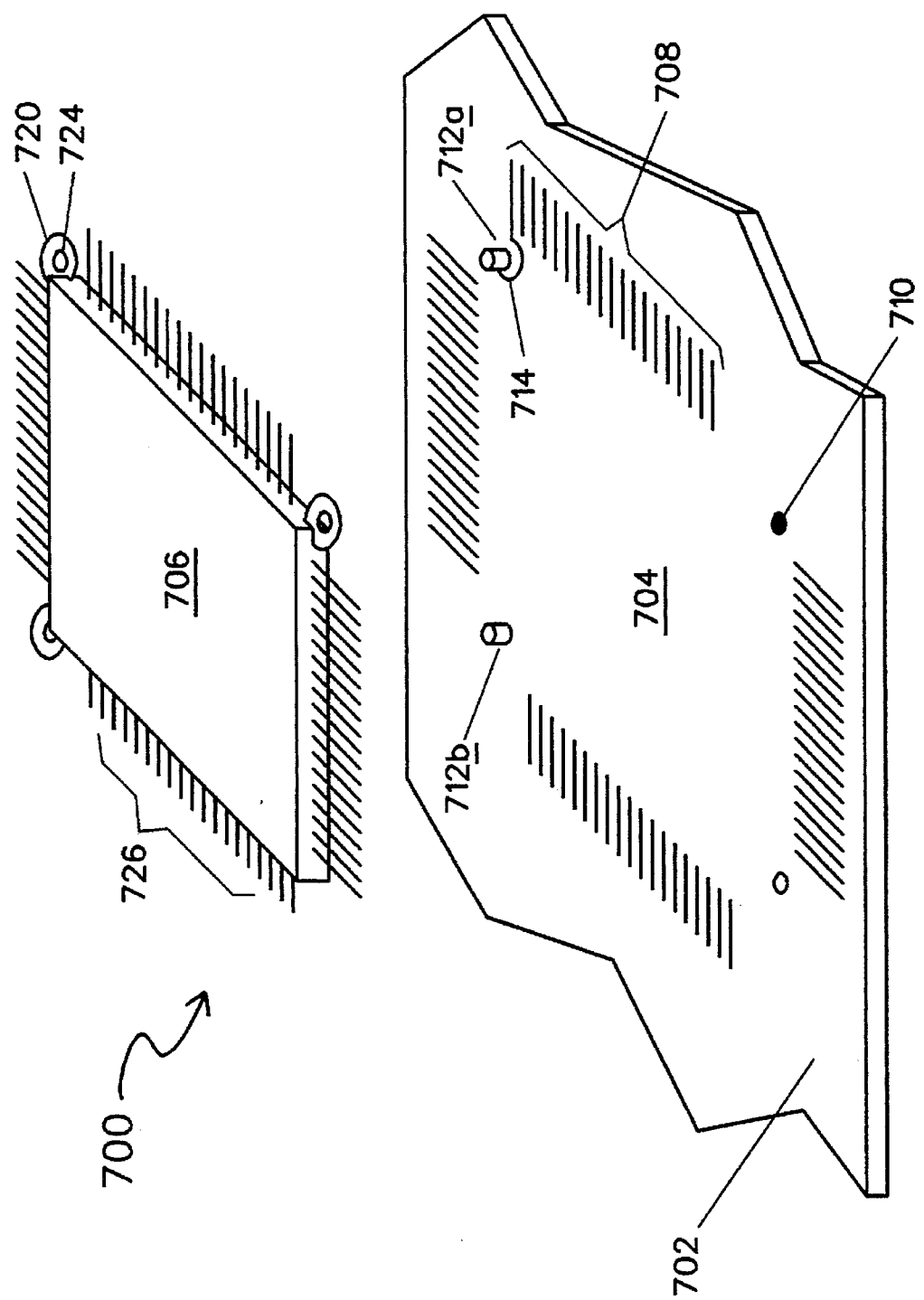
FIG. 7 is a perspective, exploded view of the semiconductor device with an alignment feature similar to that shown in FIG. 3, positioned above a printed wiring board (PWB) having a corresponding alignment feature, according to the present invention.

FIG. 7 shows a semiconductor device 700 positioned for mounting and connecting to a printed wiring board 702, according to the present invention. In this Figure, the embodiment 300 of FIG. 3 is used to illustrate locating the device with respect to a printed wiring board (PWB) as the underlying substrate.

The PWB 702 has an area 704 to which the package body 706 will be mounted. A number of fine pitch wiring traces 708 approach this area from all sides, and correspond in pitch and spacing to the pitch and spacing of the device leads 710.

The tabs 720 (320) have holes 724 (324), which can be used to align with positioning marks on the PWB. For example, a mark 710 on the PWB can be formed in the same operation (typically etching) that is used to form the wiring traces 708 on the PCB. Since the mark 710 is precisely aligned with the traces 708, and the tab 720 is precisely aligned with the device leads 726, accurate alignment of the leads and traces is ensured. The mark 710 can be a contrasting color with the PWB substrate, and can be sized to the exact size of the hole, so any misalignment of the tab and the mark would show PWB in the tab hole 724. This visual cue could be detected manually (by eye), or by automated part placement machinery, to ensure accurate positioning prior to soldering.

Another way in which accurate positioning can be ensured is to provide the PWB (underlying substrate) with a pin 712 (two pins 712 a and 712b shown in FIG. 7). The pin extends upward from the surface of the PWB 702, towards the device 700, and is sized to fit within the hole 724.

Since the tab is typically electrically connected to the die paddle (via the internal portion of the tiebar), the pin itself can be grounded and soldered to the tab. This is shown at the pin 712a, which is inserted into a PWB pad 714 having a trace extending therefrom.

Various combinations of marks (710), pins (712) and pads (714) can be employed, all of which are considered to be "corresponding alignment features" on an "underlying substrate".

The additional tab(s) at the corner(s) of the package body is formed integrally with the leadframe. Since the tabs are a part of the leadframe itself, they are inherently precisely aligned with the leads. This is due largely to the fact that techniques for forming leadframes (etching, stamping) tend to be much more precise than the techniques used for plastic molding.

Using the tabs for alignment of the package in a test socket will ensure accurate alignment of the lead ends to the socket contacts.

Using the tabs for alignment of the package in surface mounting of the semiconductor device, accurate alignment of the leads and the PWB conductive traces is ensured.

Using the tabs for alignment of the package in shipping trays the leads will not contact the tray.

Generally, using the tabs for alignment will eliminate several potential sources of lead damage, which can result in rejecting a part (semiconductor device). Hence, the invention will increase effective yield, thereby lowering costs.

We claim:

1. A method of packaging a semiconductor device to ensure alignment of the semiconductor device leads with traces of a printed wiring board, comprising the steps of:

patterning a leadframe from a conductive foil, wherein the leadframe has a plurality of leads and at least one tab element having a fixed coplanar relationship with the plurality of leads, the at least one tab element having a concave positioning means on one surface and a corresponding convex positioning means on another surface for aligning the at least one tab element with a planar substrate;

mounting a die to a central portion of the leadframe and connecting the die to inner portions of the leads;

forming a package body around the die and the central portion of the leadframe, wherein outer portions of the leads extend beyond a periphery of the package body, and extending the at least one tab element beyond the periphery of the package body and proximate thereto, wherein the at least one tab remains in the fixed coplanar relationship with the outer portions of the plurality of leads.

2. A method of aligning a packaged semiconductor device to a substrate when mounted thereto, comprising the step of:

aligning a packaged semiconductor device having a semiconductor die mounted to a leadframe formed of a foil and having a plurality of leads and at least one tab element formed from the foil at a position located proximate to the outside periphery of a package body formed about the die, the at least one tab element having a concave positioning means on one surface and a convex positioning means on another an other surface for aligning the at least one tab element with a planar substrate having at least one alignment element for positioning the semiconductor device on the substrate when the at least one alignment element engages either or both of the positioning means of the at least one tab element.

3. The method of claim 2, further comprising the step of:

aligning a plurality of leads extending from the package body with a plurality of conductive traces on the substrate when the at least one alignment element engages the at least one tab element on the substrate.

4. The method of claim 2, wherein:

the at least one tab element is provided with at least one hole; and the at least one alignment element is at least one pin protruding from a surface of the substrate so that is passes through the at least one hole of the at least one tab element when the packaged semiconductor device is positioned on the substrate.

5. The method of claim 2, wherein:

the substrate is provided with at least one alignment mark for aligning the at least one tab element when the packaged semiconductor device is placed on the substrate.

6. The method of claim 5, wherein:

the at least one alignment mark is in color contrasting with the substrate color.

* * * * *